(12) United States Patent
Biberger et al.

(10) Patent No.: US 6,748,960 B1
(45) Date of Patent: Jun. 15, 2004

(54) APPARATUS FOR SUPERCRITICAL PROCESSING OF MULTIPLE WORKPIECES

(75) Inventors: Maximilian Albert Biberger, Palo Alto, CA (US); Frederick Paul Layman, Fremont, CA (US); Thomas Robert Sutton, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 115 days.

(21) Appl. No.: 09/704,642

(22) Filed: Nov. 1, 2000

Related U.S. Application Data

(60) Provisional application No. 60/163,121, filed on Nov. 2, 1999.

(51) Int. Cl.[7] .................................................. B08B 3/00
(52) U.S. Cl. ...................................... 134/61; 134/102.2
(58) Field of Search ............................. 134/18, 26, 42, 134/61, 65, 102.2

(56) References Cited

U.S. PATENT DOCUMENTS

| | | | |
|---|---|---|---|
| 2,617,719 A | 11/1952 | Stewart | 23/312 |
| 2,625,886 A | 1/1953 | Browne | |
| 3,744,660 A | 7/1973 | Gaines et al. | |
| 3,890,176 A | 6/1975 | Bolon | 156/2 |
| 3,900,551 A | 8/1975 | Bardoncelli et al. | 423/9 |
| 3,968,885 A | 7/1976 | Hassan et al. | |
| 4,029,517 A | 6/1977 | Rand | 134/11 |
| 4,091,643 A | 5/1978 | Zucchini | 68/18 |
| 4,245,154 A | 1/1981 | Uehara et al. | |
| 4,341,592 A | 7/1982 | Shores et al. | 156/643 |
| 4,355,937 A | 10/1982 | Mack et al. | |
| 4,367,140 A | 1/1983 | Wilson | |
| 4,406,596 A | 9/1983 | Budde | |
| 4,422,651 A | 12/1983 | Platts | |
| 4,474,199 A | 10/1984 | Blaudszun | 134/105 |
| 4,475,993 A | 10/1984 | Blander et al. | 204/64 T |
| 4,522,788 A | 6/1985 | Sitek et al. | |
| 4,549,467 A | 10/1985 | Wilden et al. | |
| 4,592,306 A | 6/1986 | Gallego | 118/719 |
| 4,601,181 A | 7/1986 | Privat | 68/18 |
| 4,626,509 A | 12/1986 | Lyman | |
| 4,670,126 A | 6/1987 | Messer et al. | 204/298 |
| 4,682,937 A | 7/1987 | Credle, Jr. | |
| 4,693,777 A | 9/1987 | Hazano et al. | 156/345 |
| 4,749,440 A | 6/1988 | Blackwood et al. | 156/646 |
| 4,778,356 A | 10/1988 | Hicks | |

(List continued on next page.)

FOREIGN PATENT DOCUMENTS

| | | | |
|---|---|---|---|
| CN | 1399790 A | 2/2003 | H01L/21/00 |
| DE | 36 08 783 A1 | 9/1987 | C30B/25/12 |
| DE | 198 60 084 A1 | 7/2000 | H01L/21/3213 |

(List continued on next page.)

OTHER PUBLICATIONS

Joseph L. Foszcz, "Diaphragm Pumps Eliminate Seal Problems", Plant Engineering, pp. 1–5, Feb. 1, 1996.

(List continued on next page.)

Primary Examiner—Randy Golakowski
Assistant Examiner—Saeed Chaudhry
(74) Attorney, Agent, or Firm—Haverstock & Owens LLP

(57) ABSTRACT

An apparatus for supercritical processing of multiple workpieces comprises a transfer module, first and second supercritical processing modules, and a robot. The transfer module includes an entrance. The first and second supercritical processing modules are coupled to the transfer module. The robot is preferably located with the transfer module. In operation, the robot transfers a first workpiece from the entrance of the transfer module to the first supercritical processing module. The robot then transfers a second workpiece from the entrance to the second supercritical processing module. After the workpieces have been processed, the robot returns the first and second workpieces to the entrance of the transfer module. Alternatively, the apparatus includes additional supercritical processing modules coupled to the transfer module.

27 Claims, 9 Drawing Sheets

U.S. PATENT DOCUMENTS

| | | | |
|---|---|---|---|
| 4,788,043 A | 11/1988 | Kagiyama et al. | 422/292 |
| 4,789,077 A | 12/1988 | Noe | |
| 4,823,976 A | 4/1989 | White, III et al. | |
| 4,825,808 A | 5/1989 | Takahashi et al. | 118/719 |
| 4,827,867 A | 5/1989 | Takei et al. | |
| 4,838,476 A | 6/1989 | Rahn | 228/180.1 |
| 4,865,061 A | 9/1989 | Fowler et al. | 134/108 |
| 4,879,004 A | 11/1989 | Oesch et al. | 203/89 |
| 4,879,431 A | 11/1989 | Bertoncini | |
| 4,917,556 A | 4/1990 | Stark et al. | 414/217 |
| 4,923,828 A | 5/1990 | Gluck et al. | 437/225 |
| 4,924,892 A | 5/1990 | Kiba et al. | 134/123 |
| 4,944,837 A | 7/1990 | Nishikawa et al. | 156/646 |
| 4,951,601 A | 8/1990 | Maydan et al. | 118/719 |
| 4,960,140 A | 10/1990 | Ishijima et al. | 134/31 |
| 4,983,223 A | 1/1991 | Gessner | 134/25.4 |
| 5,011,542 A | 4/1991 | Weil | 134/38 |
| 5,013,366 A | 5/1991 | Jackson et al. | 134/1 |
| 5,044,871 A | 9/1991 | Davis et al. | |
| 5,062,770 A | 11/1991 | Story et al. | |
| 5,068,040 A | 11/1991 | Jackson | 210/748 |
| 5,071,485 A | 12/1991 | Matthews et al. | |
| 5,105,556 A | 4/1992 | Kurokawa et al. | 34/12 |
| 5,143,103 A | 9/1992 | Basso et al. | 134/98.1 |
| 5,158,704 A | 10/1992 | Fulton et al. | 252/309 |
| 5,167,716 A | 12/1992 | Boitnott et al. | |
| 5,169,296 A | 12/1992 | Wilden | |
| 5,169,408 A | 12/1992 | Biggerstaff et al. | |
| 5,174,917 A | 12/1992 | Monzyk | 252/60 |
| 5,185,058 A | 2/1993 | Cathey, Jr. | 156/656 |
| 5,185,296 A | 2/1993 | Morita et al. | 437/229 |
| 5,186,718 A | 2/1993 | Tepman et al. | 29/25.01 |
| 5,188,515 A | 2/1993 | Horn | |
| 5,190,373 A | 3/1993 | Dickson et al. | |
| 5,191,993 A | 3/1993 | Wanger et al. | |
| 5,193,560 A | 3/1993 | Tanaka et al. | 134/56 R |
| 5,195,878 A | 3/1993 | Sahiavo et al. | |
| 5,213,485 A | 5/1993 | Wilden | |
| 5,213,619 A | 5/1993 | Jackson et al. | 134/1 |
| 5,215,592 A | 6/1993 | Jackson | 134/1 |
| 5,217,043 A | 6/1993 | Novakovi | |
| 5,221,019 A | 6/1993 | Pechacek | |
| 5,222,876 A | 6/1993 | Budde | |
| 5,224,504 A | 7/1993 | Thompson et al. | |
| 5,225,173 A | 7/1993 | Wai | 423/2 |
| 5,236,602 A | 8/1993 | Jackson | 210/748 |
| 5,236,669 A | 8/1993 | Simmons et al. | |
| 5,237,824 A | 8/1993 | Pawliszyn | 62/51.1 |
| 5,240,390 A | 8/1993 | Kvinge et al. | |
| 5,243,821 A | 9/1993 | Schuck et al. | |
| 5,246,500 A | 9/1993 | Samata et al. | |
| 5,251,776 A | 10/1993 | Morgan, Jr. et al. | |
| 5,261,965 A | 11/1993 | Moslehi | 134/1 |
| 5,266,205 A | 11/1993 | Fulton et al. | 210/639 |
| 5,267,455 A | 12/1993 | Dewees et al. | 68/5 |
| 5,274,129 A | 12/1993 | Natale et al. | 549/349 |
| 5,280,693 A | 1/1994 | Heudecker | |
| 5,285,352 A | 2/1994 | Pastore et al. | |
| 5,288,333 A | 2/1994 | Tanaka et al. | |
| 5,290,361 A | 3/1994 | Hayashida et al. | 134/2 |
| 5,294,261 A | 3/1994 | McDermott et al. | 134/7 |
| 5,304,515 A | 4/1994 | Morita et al. | 437/231 |
| 5,306,350 A | 4/1994 | Hoy et al. | 134/22 |
| 5,313,965 A * | 5/1994 | Palen | 134/61 |
| 5,314,574 A | 5/1994 | Takahashi | 156/646 |
| 5,316,591 A | 5/1994 | Chao et al. | 134/34 |
| 5,328,722 A | 7/1994 | Ghanayem et al. | 427/250 |
| 5,334,332 A | 8/1994 | Lee | 252/548 |
| 5,334,493 A | 8/1994 | Fujita et al. | 430/463 |
| 5,337,446 A | 8/1994 | Smith et al. | 15/21.1 |
| 5,339,844 A | 8/1994 | Stanford, Jr. et al. | |
| 5,352,327 A | 10/1994 | Witowski | 156/646 |
| 5,355,901 A | 10/1994 | Mielnik et al. | 134/105 |
| 5,356,538 A | 10/1994 | Wai et al. | 210/634 |
| 5,368,171 A | 11/1994 | Jackson | 134/147 |
| 5,370,740 A | 12/1994 | Chao et al. | 134/1 |
| 5,370,741 A | 12/1994 | Bergman | |
| 5,377,705 A | 1/1995 | Smith, Jr. et al. | 134/95.3 |
| 5,401,322 A | 3/1995 | Marshall | 134/13 |
| 5,403,621 A | 4/1995 | Jackson et al. | 427/255.1 |
| 5,404,894 A * | 4/1995 | Shiraiwa | 118/500 |
| 5,412,958 A | 5/1995 | Iliff et al. | |
| 5,417,768 A | 5/1995 | Smith, Jr. et al. | |
| 5,433,334 A | 7/1995 | Reneau | |
| 5,447,294 A | 9/1995 | Sakata et al. | |
| 5,456,759 A | 10/1995 | Stanford, Jr. et al. | 134/1 |
| 5,470,393 A | 11/1995 | Fukazawa | 134/3 |
| 5,482,564 A | 1/1996 | Douglas et al. | 134/18 |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,503,176 A | 4/1996 | Dunmire et al. | |
| 5,505,219 A | 4/1996 | Lansberry et al. | |
| 5,509,431 A | 4/1996 | Smith, Jr. et al. | |
| 5,514,220 A | 5/1996 | Wetmore et al. | 134/22.18 |
| 5,522,938 A | 6/1996 | O'Brien | 134/1 |
| 5,526,834 A | 6/1996 | Mielnik et al. | 134/105 |
| 5,533,538 A | 7/1996 | Marshall | 134/104.4 |
| 5,547,774 A | 8/1996 | Gimzewski et al. | 428/694 |
| 5,550,211 A | 8/1996 | DeCrosta et al. | 528/480 |
| 5,571,330 A | 11/1996 | Kyogoku | |
| 5,580,846 A | 12/1996 | Hayashida et al. | 510/175 |
| 5,589,105 A | 12/1996 | DeSimone et al. | 252/351 |
| 5,589,224 A | 12/1996 | Tepman et al. | |
| 5,621,982 A | 4/1997 | Yamashita et al. | |
| 5,629,918 A | 5/1997 | Ho et al. | |
| 5,632,847 A | 5/1997 | Ohno et al. | 156/344 |
| 5,635,463 A | 6/1997 | Muraoka | 510/175 |
| 5,637,151 A | 6/1997 | Schulz | 134/2 |
| 5,641,887 A | 6/1997 | Beckman et al. | 546/26.2 |
| 5,644,855 A | 7/1997 | McDermott et al. | |
| 5,649,809 A | 7/1997 | Stapelfeldt | |
| 5,656,097 A | 8/1997 | Olesen et al. | 134/1 |
| 5,665,527 A | 9/1997 | Allen et al. | 430/325 |
| 5,669,251 A | 9/1997 | Townsend et al. | |
| 5,679,169 A | 10/1997 | Gonzales et al. | 134/1.3 |
| 5,679,171 A | 10/1997 | Saga et al. | 134/3 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,702,228 A | 12/1997 | Tamai et al. | |
| 5,706,319 A | 1/1998 | Holtz | |
| 5,726,211 A | 3/1998 | Hedrick et al. | 521/61 |
| 5,730,874 A | 3/1998 | Wai et al. | 210/638 |
| 5,739,223 A | 4/1998 | DeSimone | 526/89 |
| 5,746,008 A | 5/1998 | Yamashita et al. | |
| 5,783,082 A | 7/1998 | DeSimone et al. | 210/634 |
| 5,797,719 A | 8/1998 | James et al. | 417/46 |
| 5,798,126 A | 8/1998 | Fujikawa et al. | 425/78 |
| 5,798,438 A | 8/1998 | Sawan et al. | 528/483 |
| 5,804,607 A | 9/1998 | Hedrick et al. | 521/64 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,882,165 A | 3/1999 | Maydan et al. | 414/217 |
| 5,888,050 A | 3/1999 | Fitzgerald et al. | |
| 5,898,727 A | 4/1999 | Fujikawa et al. | 373/110 |
| 5,900,107 A | 5/1999 | Murphy et al. | |

| | | |
|---|---|---|
| 5,904,737 A | 5/1999 | Preston et al. |
| 5,908,510 A | 6/1999 | McCullough et al. ........... 134/2 |
| 5,928,389 A | 7/1999 | Jevtic ......................... 29/25.01 |
| 5,932,100 A | 8/1999 | Yager et al. |
| 5,934,856 A | 8/1999 | Asakawa et al. ............ 414/217 |
| 5,934,991 A | 8/1999 | Rush |
| 5,944,996 A | 8/1999 | DeSimone et al. .......... 210/634 |
| 5,955,140 A | 9/1999 | Smith et al. ................... 427/96 |
| 5,965,025 A | 10/1999 | Wai et al. ..................... 210/634 |
| 5,976,264 A | 11/1999 | McCullough et al. ........... 134/2 |
| 5,979,306 A | 11/1999 | Fujikawa et al. .............. 100/90 |
| 5,980,648 A | 11/1999 | Adler ........................... 134/34 |
| 5,981,399 A | 11/1999 | Kawamura et al. |
| 5,989,342 A | 11/1999 | Ikeda et al. |
| 6,005,226 A | 12/1999 | Aschner et al. |
| 6,017,820 A | 1/2000 | Ting et al. .................... 438/689 |
| 6,024,801 A | 2/2000 | Wallace et al. ................. 134/1 |
| 6,029,371 A | 2/2000 | Kamikawa et al. |
| 6,035,871 A * | 3/2000 | Eui-Yeol ................. 134/102.2 |
| 6,037,277 A | 3/2000 | Masakara et al. |
| 6,053,348 A | 4/2000 | Morch |
| 6,056,008 A | 5/2000 | Adams et al. |
| 6,067,728 A | 5/2000 | Farmer et al. ................. 34/470 |
| 6,077,053 A | 6/2000 | Fujikawa et al. ............ 417/399 |
| 6,077,321 A | 6/2000 | Adachi et al. .............. 29/25.01 |
| 6,082,150 A | 7/2000 | Stucker |
| 6,085,935 A | 7/2000 | Malchow et al. |
| 6,097,015 A | 8/2000 | McCullough et al. |
| 6,110,232 A | 8/2000 | Chen et al. ................. 29/25.01 |
| 6,128,830 A | 10/2000 | Bettcher et al. |
| 6,145,519 A | 11/2000 | Konishi et al. |
| 6,149,828 A | 11/2000 | Vaartstra ...................... 216/57 |
| 6,159,295 A | 12/2000 | Maskara et al. |
| 6,164,297 A | 12/2000 | Kamikawa |
| 6,186,722 B1 | 2/2001 | Shirai ......................... 414/217 |
| 6,203,582 B1 | 3/2001 | Berner et al. |
| 6,216,364 B1 | 4/2001 | Tanaka et al. |
| 6,228,563 B1 | 5/2001 | Starov et al. ................ 430/327 |
| 6,235,634 B1 | 5/2001 | White et al. ................. 438/680 |
| 6,239,038 B1 | 5/2001 | Wen |
| 6,241,825 B1 | 6/2001 | Wytman |
| 6,242,165 B1 | 6/2001 | Vaartstra ..................... 430/329 |
| 6,244,121 B1 | 6/2001 | Hunter ...................... 72/865.9 |
| 6,251,250 B1 | 6/2001 | Keigler |
| 6,277,753 B1 | 8/2001 | Mullee et al. |
| 6,286,231 B1 | 9/2001 | Bergman et al. |
| 6,305,677 B1 | 10/2001 | Lenz |
| 6,319,858 B1 | 11/2001 | Lee et al. .................... 438/787 |
| 6,334,266 B1 | 1/2002 | Moritz et al. |
| 6,344,174 B1 | 2/2002 | Miller et al. |
| 6,388,317 B1 | 5/2002 | Reese |
| 6,389,677 B1 | 5/2002 | Lenz |
| 6,418,956 B1 | 7/2002 | Bloom |
| 6,436,824 B1 | 8/2002 | Chooi et al. |
| 6,454,945 B1 | 9/2002 | Weigl et al. |
| 6,464,790 B1 | 10/2002 | Sherstinsky et al. |
| 6,521,466 B1 | 2/2003 | Castrucci |
| 6,541,278 B2 | 4/2003 | Morita et al. |
| 6,546,946 B2 | 4/2003 | Dunmire |
| 6,550,484 B1 | 4/2003 | Gopinath et al. |
| 6,558,475 B1 | 5/2003 | Jur et al. |
| 6,561,213 B2 | 5/2003 | Wang et al. |
| 6,561,220 B2 | 5/2003 | McCullough et al. |
| 6,561,481 B1 | 5/2003 | Filonczuk |
| 6,561,767 B2 | 5/2003 | Biberger et al. |
| 6,564,826 B2 | 5/2003 | Shen |
| 2002/0001929 A1 | 1/2002 | Biberger et al. |

FOREIGN PATENT DOCUMENTS

| | | | | |
|---|---|---|---|---|
| EP | 0 244 951 A2 | 11/1987 | ........... H01L/21/00 |
| EP | 0 272 141 A2 | 6/1988 | ........... H01L/21/00 |
| EP | 0 283 740 A2 | 9/1988 | ............. C22B/3/00 |
| EP | 0 391 035 | 10/1990 | ............. C23G/5/00 |
| EP | 0 453 867 A1 | 10/1991 | ........... F16K/51/02 |
| EP | 0 536 752 A2 | 4/1993 | ............. C11D/3/20 |
| EP | 0 572 913 A1 | 12/1993 | ........... B01D/11/02 |
| EP | 0 679 753 B1 | 11/1995 | ........... D06F/43/00 |
| EP | 0 726 099 A2 | 8/1996 | ............. B08B/5/00 |
| EP | 0 836 895 A2 | 4/1998 | ............. B08B/7/00 |
| EP | 0 903 775 A2 | 3/1999 | ........... H01L/21/00 |
| FR | 1.499.491 | 9/1967 | |
| GB | 2 003 975 | 3/1979 | ........... F04B/43/06 |
| GB | 2 193 482 A | 2/1988 | ............. B25J/18/02 |
| JP | 56-142629 | 11/1981 | ......... H01L/21/205 |
| JP | 60-192333 | 9/1985 | ........... H01L/21/30 |
| JP | 60-238479 | 11/1985 | ........... C23C/14/56 |
| JP | 60-246635 | 12/1985 | ......... H01L/21/302 |
| JP | 61-231166 | 10/1986 | ........... C23C/14/24 |
| JP | 63-303059 | 12/1988 | ........... C23C/14/22 |
| JP | 1045131 | 2/1989 | ........... B01D/11/04 |
| JP | 2-148841 | 6/1990 | ......... H01L/21/306 |
| JP | 2-209729 | 8/1990 | ......... H01L/21/302 |
| JP | 727711 | 2/1996 | ......... H01L/21/027 |
| JP | 8-186140 | 7/1996 | ........... H01L/21/56 |
| JP | 8222508 | 8/1996 | ......... H01L/21/027 |
| JP | 10-144757 | 5/1998 | ........... H01L/21/68 |
| JP | 10-335408 | 12/1998 | ........... H01L/21/31 |
| JP | 11-200035 | 7/1999 | ........... C23C/14/34 |
| SE | 251213 | 8/1948 | |
| WO | WO 87/07309 | 12/1987 | ........... C23C/16/00 |
| WO | WO 90/06189 | 6/1990 | ............. B08B/7/00 |
| WO | WO 90/13675 | 11/1990 | ............. C22B/3/00 |
| WO | WO 91/12629 | 8/1991 | ........... H01L/21/00 |
| WO | WO 99/186603 | 4/1999 | ........... H01L/21/00 |
| WO | WO 99/49998 | 10/1999 | ............. B08B/5/00 |
| WO | WO 00/36635 | 6/2000 | ........... H01L/21/00 |
| WO | WO 01/10733 A1 | 2/2001 | ........... B65D/55/00 |
| WO | WO 01/33615 A3 | 5/2001 | ........... H01L/21/00 |
| WO | WO 01/55628 A1 | 8/2001 | ........... F16K/51/02 |
| WO | WO 01/68279 A2 | 9/2001 | ............. B08B/7/00 |
| WO | WO 01/74538 A1 | 10/2001 | ............. B24C/1/00 |
| WO | WO 01/78911 A1 | 10/2001 | |
| WO | WO 01/85391 A2 | 11/2001 | |
| WO | WO 01/94782 A3 | 12/2001 | ........... F04B/43/02 |
| WO | WO 02/16051 A2 | 2/2002 | |
| WO | WO 03/030219 A2 | 10/2003 | |

OTHER PUBLICATIONS

Bob Agnew, "Wilden Air–Operated Diaphragm Pumps", Process & Industrial Training Technologies, Inc., 1996.

Hideaki Itakura et al., "Multi–Chamber Dry Etching System", Solid State Technology, Apr. 1982, pp. 209–214.

Guan, Z. et al., "Fluorocarbon–Based Heterophase Polymeric Materials. 1. Block Copolymer Surfactants for Carbon Dioxide Applications," Macromolecules, vol. 27, 1994, pp. 5527–5532.

International Journal of Environmentally Conscious Design & Manufacturing, vol. 2, No. 1, 1993, p. 83.

Journal of the American Ceramic Society, vol. 72, No. 6, pp. 872–874.

Ziger, D.H. et al., "Compressed Fluid Technology: Application to RIE Developed Resists," AIChE Journal, vol. 33, No. 10, Oct. 1987, pp. 1585–1591.

Kirk–Othmer, "Encyclopedia of Chemical Terminology," 3rd ed., Supplement Volume, "Alcohol Fuels to Toxicology," 1984, pp. 872–893.

"Cleaning with Supercritical $CO_2$," NASA Tech Briefs, MFS–26911, Marshall Space Flight Center, Alabama, Mar. 1979.

Basta, N., "Supercritical Fluids: Still Seeking Acceptance," Chemical Engineering, vol. 92, No. 3, Feb. 24, 1985, 14.

Takahashi, D., "Los Alomos Lab finds way to cut chip toxic waste," Wall Street Journal, Jun. 22, 1998.

Supercritical CO, process offers mess from semiconductor plants, Chemical Engineering Magazine, pp. 27 & 29, Jul. 1998.

Sun, Y.P. et al., "Preparation of polymer–protected semiconductor nanoparticles through the rapid expansion of supercritical fluid solution," Chemical Physics Letters, pp. 585–588, May 22, 1998.

Jackson, K. et al., "Surfactants and Micromulsions in Supercritical Fluids" in "Supercritical Fluid Cleaning." Noyes Publications, Westwood, NJ, pp. 87–120, Spring 1998.

Bakker, G.L. et al., "Surface Cleaning and Carbonaceous Film Removal Using High Pressure, High Temperature Water, and Water/CO2 Mixtures," J. Electrochem, Soc, vol. 145, No. 1, pp. 284–291, Jan. 1998.

Ober, C.K. et al., "Imaging polymers with supercritical carbon dioxide," Advanced Materials, vol. 9, No. 13, 99. 1039–1043, Nov. 3, 1997.

Russick, E.M. et al., "Supercritical carbon dioxide extraction of solvent from micromachined structures." Supercritical Fluids Extraction and Pollution Prevention, ACS Symposium Series, vol. 670, pp. 255–269,Oct. 21, 1997.

Dahmen, N. et al., "Supercritical fluid extraction of grinding and metal cutting waste contaminated with oils, "Supercritical Fluids—Extraction and Pollution Prevention, ACS Symposium Series, vol. 670, pp. 270–279, Oct. 21, 1997.

Wai, C.M., "Supercritical fluid extraction: metals as complexes," J. Chromatography A, vol. 785, pp. 369–383, Oct. 17, 1997.

Xu, C. et al., Submicron–sized spherical ytrium oxide based phosphors prepared by supercritical CO2–assisted aerosolization and pyrolysis, Appl. Phys. Lett., vol. 71, No. 12, Sep. 22, 1997.

Tomioka Y et al., "Decomposition of tetramethylammonium (TMA) in a positive photoresist developer by supercritical water," Abstracts of Papers $214^{th}$ ACS Natl Meeting, American Chemical Society, Abstract No. 108, Sep. 7, 1997.

Klein, H. et al., "Cyclic organic carbonates serve as solvents and reactive diluents," Coatings Worlds, pp. 38–40, May 1997.

Buhler, J. et al., Liner array of complementary metal oxide semiconductor double–pass metal micromirrors, Opt. Eng., vol. 36, No. 5, pp. 1391–1398, May 1997.

Jo, M.H. et al., Evaluation of SIO2 aerogel thin film with ultra low dielectric constant as an intermetal dielectric, Microelectronic Engineering, vol. 33, pp. 343–348, Jan. 1997.

McClain, J.B. et al., "Design of Nonionic Surfactants for supercritical carbon dioxide," Science, vol. 27, Dec. 20, 1996.

Znaidi, L. et al., "Batch and semi–continous synthesis of magnesium oxide powders from hydrolysis and supercritical treatment of Mg(OCH3)2," Materials Research Bulletin, vol. 31, No. 12, pp. 1527–1335, Dec. 1996.

Tadros, M.E., "Synthesis of titanium dioxide particles in supercritical CO2" J. Supercritical Fluids, vol. 9, No. 3, pp. 172–176, Sep. 1996.

Courtecuisse, V.G. et al., "Kinetics of the titanium isopropoxide decomposition in supercritical isopropyl alcohol," ind. Eng. Chem. Res., vol. 35, No. 8, pp. 2539–2545, Aug. 1996.

Gabor, A, et al., "Block and random copolymer resists designed for 193 nm lithography and environmentally friendly supercritical CO2 Development," Dept. Mat. Sci. & Eng. Cornell Univ., SPIE, vol. 2724, pp. 410–417, Jun. 1995.

Schimek, G. L. et al., "Supercritical ammonium synthesis and characterization of four new alkai metal silver antimony sulfides . . . ," J. Solid State Chemistry, vol. 123 pp. 277–284, May 1996.

Gallagher–Wetmore, P. et al., "Supercritical fluid processing: Opportunities for new resist materials and processes," IBM research Division, SPIE, vol. 2725, pp. 289–299, Apr. 1996.

Papathomas, K.J. et al., "Debonding of photoresist by organic solvents," J. Applied Polymer Science, vol. 59, pp. 2029–2037, Mar. 28, 1996.

Watkins, J.J. et al., "Polymer/metal nanocomposite synthesis in supercritical CO2," Chemistry of Materials, vol. 7, No. 11, Nov. 1995.

Gloyna, E.F. et al., "Supercritical water oxidation research and development update," Environment Progress, vol. 14, No. 3, pp. 182–192, Aug. 1995.

Gallagher–Wetmore, P. et al., Supercritical fluid processing: A new dry technique for photoresist developing, IBM Research Division SPIE vol. 2438, pp. 694–708, Jun. 1995.

Gabor, A. H. et al., "Silicon–containing block copolymer resist materials" Microelectronics Technology—Polymers for Advanced Imaging and Packaging , ACS Symposium Series, vol. 614, pp. 281–298, Apr. 1995.

Tsiartas, P.C. et al., "Effect of molecular weight distribution on the dissolution properties of novolac blends," SPIE, vol. 2438, pp. 264–271, 1995.

Allen, R.D. et al., "Performance properties of near–monodisperse novolak resins,"SPIES, vol. 2438, pp. 250–260, 1995.

Wood, P.T. et al., "Synthesis of new channeled structures in supercritical amines . . . ," Inorg. Chem., vol. 33, pp. 1556–1558, 1994.

Jerome, J.E. et al., "Synthesis of new low–dimensional quarternary compounds . . . ," Inorg. Chem, vol. 33, 1733–1734, 1994.

McHardy, J. et al., "Progress in supercritical CO2 cleaning," SAMPE Jour., vol. 29, No. 5, pp. 20–27, Sep. 1993.

Purtell, R, et al., "Percision parts cleaning using supercritical fluids, " J. Vac, Sci, Technol. A. vol. 11, No. 4, Jul. 1993.

Bok, E, et al., "Supercritical fluids for single wafer cleaning," Solids State Technology, pp. 117–120, Jun. 1992.

Adschiri, T. et al., "Rapid and continuous hydrothermal crystallization of metal oxide particles in supercritical water," J. Am. Ceram. Soc., vol. 75, No. 4, pp. 1019–1022, 1992.

Hansen, B.N. et al., "Supercritical fluid transport—chemical deposition of films,"Chem. Mater., vol. 4, No. 4, pp. 749–752, 1992.

Page, S.H. et al., "Predictability and effect of phase behavior of CO2/ propylene carbonate in supercritical fluid chromatography," J. Mcirol. Sep, vol. 3, No. 4, pp. 355369, 1991.

Brokamp, T. et al., "Synthese und Kristallstruktur eines gemischivalenten Lithium–Tantainirids Li2Ta3Ns," J. Alloys and Compounds, vol. 176. pp. 47–60, 1991.

Hybertson, B.M. et al., "Deposition of palladium films by a novel supercritical fluid transport chemical deposition process," Mat. Res. Bull., vol. 26, pp. 1127–1133, 1991.

Ziger, D. H. et al., "Compressed fluid technology: Applications to RIE–Developed resists," AiChE Jour., vol. 33, No. 10, pp. 1585–1591, Oct. 1987.

Matson, D.W. et al., "Rapid expansion of supercritical fluid solutions: Solute formation of powders, thin films, and fibers," Ind. Eng. Chem. Res., vol. 26, No. 11, pp. 2298–2306, 1987.

Tolley, W.K. et al., "Stripping organics from metal and mineral surfaces using supercritical fluids," Separation Science and Technology, vol. 22, pp. 1087–1101, 1987.

"Final report on the safety assessment of propylene carbonate," J. American College of Toxicology, vol. 6, No. 1, pp. 23–51.

"A Comparison of Chilled DI Water/Ozone and Co2–Based Supercritical Fluids as Replacements for Photoresist–Stripping Solvents" by J.B. Rubin et al., Physical Organic Chemistry Group (CST–12) Chemical Science & Technology Division Los Alamos National Laboratory, Los Alamos, New Mexico.

* cited by examiner

APPARATUS FOR SUPERCRITICAL PROCESSING OF MULTIPLE WORKPIECES

RELATED APPLICATIONS

This application claims priority from U.S. Provisional Patent Application No. 60/163,121 filed on Nov. 2, 1999, which is incorporated by reference.

FIELD OF THE INVENTION

This invention relates to the field of supercritical processing. More particularly, this invention relates to the field of supercritical processing where multiple workpieces are processed simultaneously.

BACKGROUND OF THE INVENTION

Semiconductor fabrication uses photoresist in ion implantation, etching, and other processing steps. In the ion implantation steps, the photoresist masks areas of a semiconductor substrate that are not implanted with a dopant. In the etching steps, the photoresist masks areas of the semiconductor substrate that are not etched. Examples of the other processing steps include using the photoresist as a blanket protective coating of a processed wafer or the blanket protective coating of a MEMS (micro electromechanical system) device. Following the ion implantation steps, the photoresist exhibits a hard outer crust covering a jelly-like core. The hard outer crust leads to difficulties in a photoresist removal. Following the etching steps, remaining photoresist exhibits a hardened character that leads to difficulties in the photoresist removal. Following the etching steps, residue (photoresist residue mixed with etch residue) coats sidewalls of etch features. Depending on a type of etching step and material etched, the photoresist residue mixed with the etch residue presents a challenging removal problem since the photoresist residue mixed with the etch residue often strongly bond to the sidewalls of the etch features.

Typically, in the prior art, the photoresist and the residue are removed by plasma ashing in an $O_2$ plasma followed by cleaning in a wet-clean bath. A semiconductor etching and metallization process of the prior art is illustrated in block diagram format in FIG. 1. The semiconductor etching and metallization process 10 includes a photoresist application step 12, a photoresist exposure step 14, a photoresist development step 16, a dielectric etch step 18, an ashing step 20, a wet cleaning step 22, and a metal deposition step 24. In the photoresist application step 12, the photoresist is applied to a wafer having an exposed oxide layer. In the photoresist exposure step 14, the photoresist is exposed to light which is partially blocked by a mask.

Depending upon whether the photoresist is a positive or negative photoresist, either exposed photoresist or non-exposed photoresist, respectively, is removed in the photoresist development step 16 leaving a exposed pattern on the oxide layer. In the dielectric etch step 18, the exposed pattern on the oxide layer is etched in an RIE (reactive ion etch) process which etches the exposed pattern into the oxide layer, forming an etched pattern, while also partially etching the photoresist. This produces the residue which coats the sidewalls of the etch features while also hardening the photoresist. In the ashing step 20, the $O_2$ plasma oxidizes and partially removes the photoresist and the residue. In the wet cleaning step 22, remaining photoresist and residue is cleaned in the wet-clean bath.

In the metal deposition step 24, a metal layer is deposited on the wafer filling the etched pattern and also covering non-etched regions. In subsequent processing, at least part of the metal covering the non-etched regions is removed in order to form a circuit.

Nishikawa et al. in U.S. Pat. No. 4,944,837, issued on Jul. 31, 1990, recite a prior art method of removing a resist using liquidized or supercritical gas. A substrate with the resist is placed into a pressure vessel, which also contains the liquidized or supercritical gas. After a predetermined time lapse, the liquidized or supercritical gas is rapidly expanded, which removes the resist.

Nishikawa et al. teach that supercritical $CO_2$ can be used as a developer for photoresist. A substrate with a photoresist layer is exposed in a pattern to light, thus forming a latent image. The substrate with the photoresist and the latent image is placed in a supercritical $CO_2$ bath for 30 minutes. The supercritical $CO_2$ is then condensed leaving the pattern of the photoresist. Nishikawa et al. further teach that 0.5% by weight of methyl isobutyl ketone (MIBK) can be added to the supercritical $CO_2$, which increases an effectiveness of the supercritical $CO_2$ and, thus, reduces a development time from the 30 minutes to 5 minutes.

Nishikawa et al. also teach that a photoresist can be removed using the supercritical $CO_2$ and 7% by weight of the MIBK. The substrate with the photoresist is placed in the supercritical $CO_2$ and the MIBK for 30–45 minutes. Upon condensing the supercritical $CO_2$, the photoresist has been removed.

The methods taught by Nishikawa et al. are inappropriate for a semiconductor fabrication line for a number of reasons. Rapidly expanding a liquidized or supercritical gas to remove a photoresist from a substrate creates a potential for breakage of the substrate. A photoresist development process which takes 30 minutes is too inefficient. A photoresist development or removal process which uses MIBK is not preferred because MIBK is toxic and because MIBK is used only when a more suitable choice is unavailable.

Smith, Jr. et al. in U.S. Pat. No. 5,377,705, issued on Jan. 3, 1995, teach a system for cleaning contaminants from a workpiece. The contaminants include organic, particulate, and ionic contaminants. The system includes a pressurizable cleaning vessel, a liquid $CO_2$ storage container, a pump, a solvent delivery system, a separator, a condenser, and various valves. The pump transfers $CO_2$ gas and solvent to the cleaning vessel and pressurizes the $CO_2$ gas to supercritical $CO_2$. The supercritical $CO_2$ and the solvent remove the contaminants from the workpiece. A valve allows some of the supercritical $CO_2$ and the solvent to bleed from the cleaning vessel while the pump replenishes the supercritical $CO_2$ and the solvent. The separator separates the solvent from the supercritical $CO_2$. The condenser condenses the $CO_2$ to liquid $CO_2$ so that the liquid $CO_2$ storage container can be replenished.

Employing a system such as taught by Smith, Jr. et al. for removing photoresist and residue presents a number of difficulties. The pressurizable cleaning vessel is not configured appropriately for semiconductor substrate handling. It is inefficient to bleed the supercritical $CO_2$ and the solvent during cleaning. Such a system is not readily adaptable to throughput requirements of a semiconductor fabrication line. Such a system is not conducive to safe semiconductor substrate handling, which is crucial in a semiconductor fabrication line. Such a system is not economical for semiconductor substrate processing.

What is needed is a method of developing photoresist using supercritical carbon dioxide appropriate for a semiconductor fabrication line.

What is needed is a method of removing photoresist using supercritical carbon dioxide appropriate for a semiconductor fabrication line.

What is needed is a supercritical processing system which is configured for handling semiconductor substrates.

What is needed is a supercritical processing system in which supercritical $CO_2$ and solvent are not necessarily bled from a processing chamber in order to create a fluid flow within the processing chamber.

What is needed is a supercritical processing system which meets throughput requirements of a semiconductor fabrication line.

What is needed is a supercritical processing system which provides safe semiconductor substrate handling.

What is needed is a supercritical processing system which provides economical semiconductor substrate processing.

SUMMARY OF THE INVENTION

The present invention is an apparatus for supercritical processing of multiple workpieces. The apparatus includes a transfer module, first and second supercritical processing modules, and a robot. The transfer module includes an entrance. The first and second supercritical processing modules are coupled to the transfer module. The robot is preferably located within the transfer module. In operation, the robot transfers a first workpiece from the entrance of the transfer module to the first supercritical processing module. The robot then transfers a second workpiece from the entrance to the second supercritical processing module. After the workpieces have been processed, the robot returns the first and second workpieces to the entrance of the transfer module. Alternatively, the apparatus includes additional supercritical processing modules coupled to the transfer module.

DETAILED DESCRIPTION OF THE PREFERRED EMBODIMENT

Figure 1:
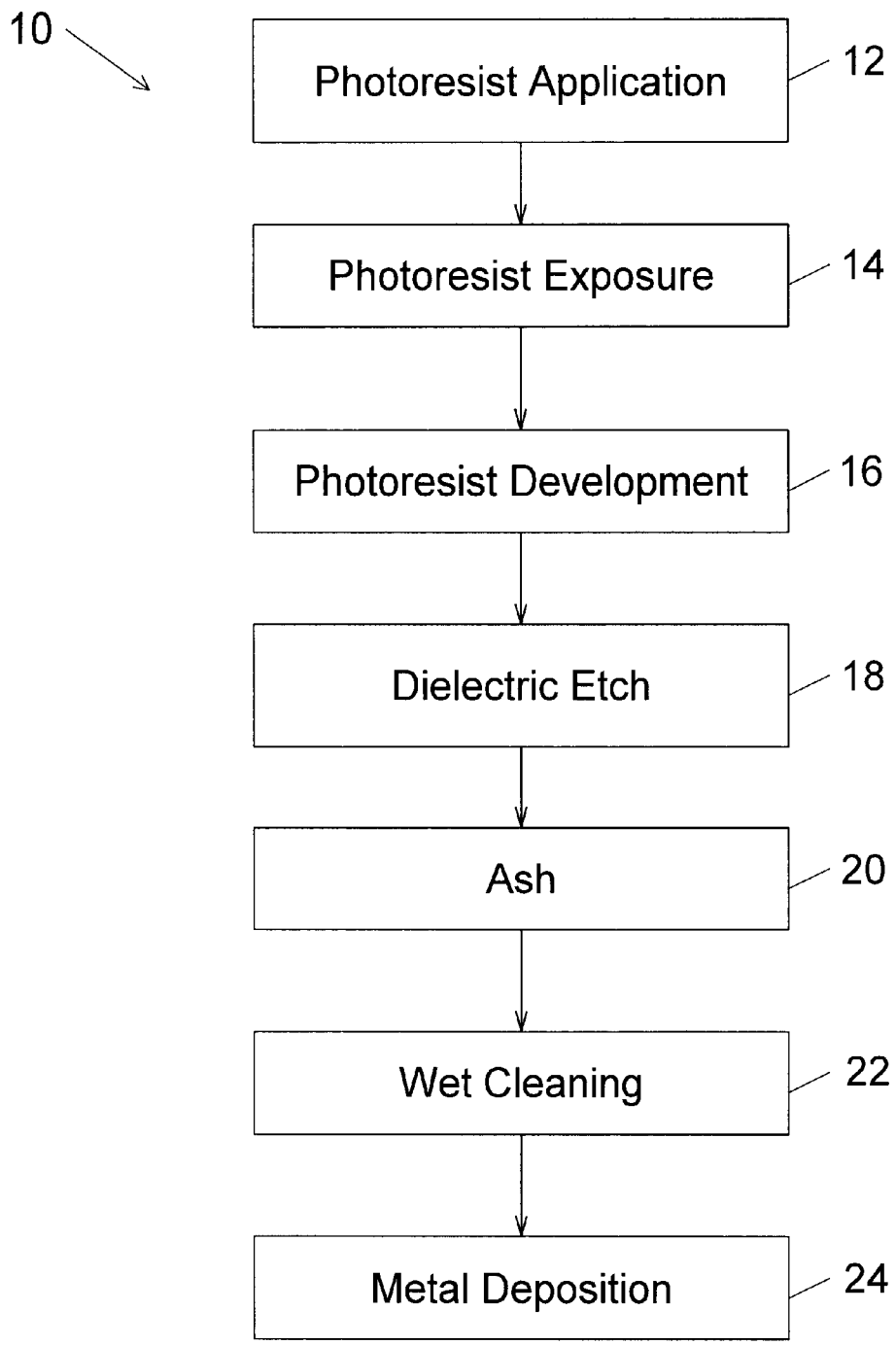
FIG. 1 illustrates, in block diagram format, a process flow for a semiconductor etching and metallization process of the prior art.
Figure 2:
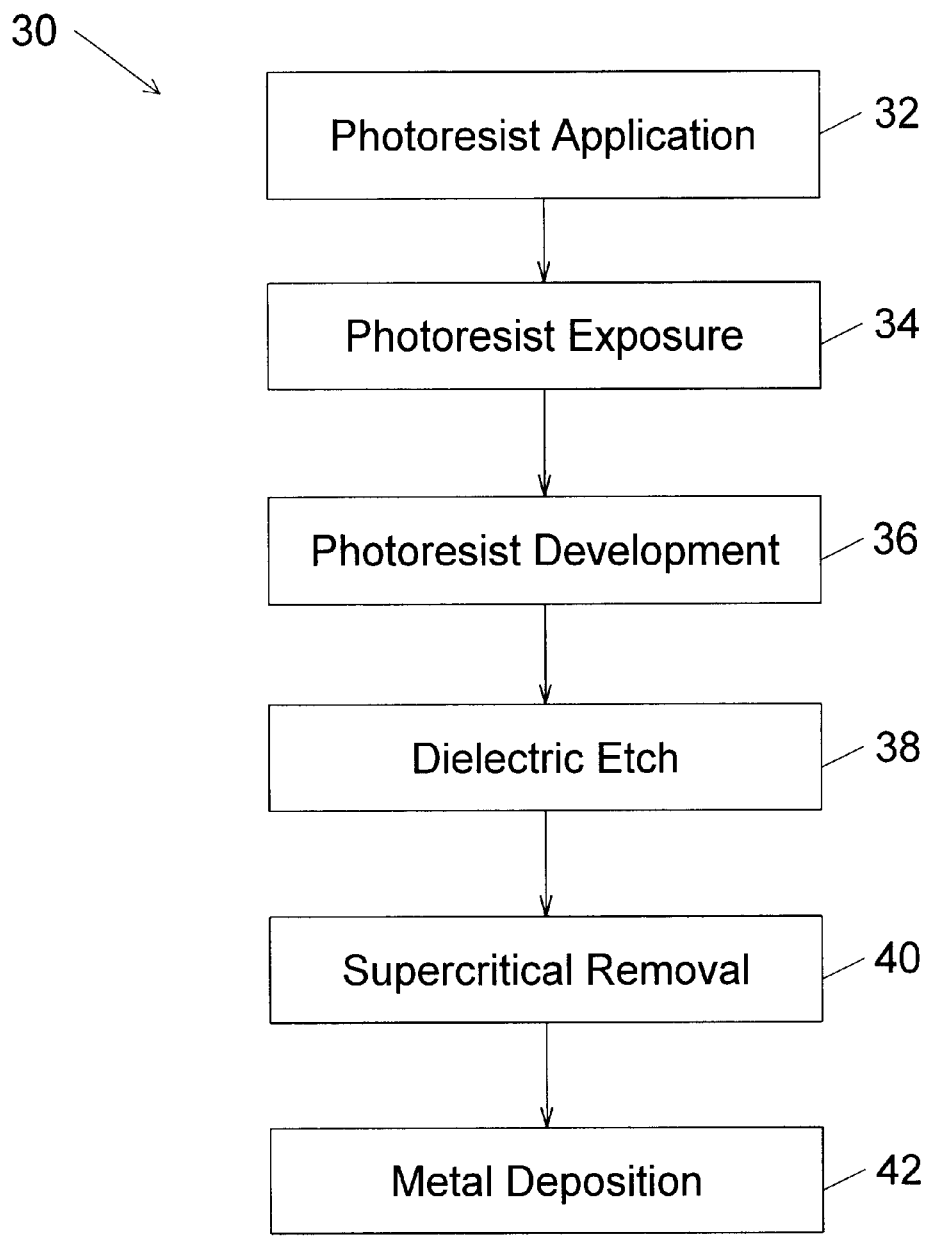
FIG. 2 illustrates, in block diagram format, a process flow for a semiconductor etching and metallization process of the present invention.

A semiconductor etch and metallization process of the present invention is illustrated, as a block diagram, in FIG. 2. The semiconductor etch and metallization process 30 includes a photoresist application step 32, a photoresist exposure step 34, a photoresist development step 36, a dielectric etch step 38, a supercritical removal process 40, and a metal deposition step 42. In the photoresist application step 32, the photoresist is applied to a wafer having an exposed oxide layer. In the photoresist exposure step 34, the photoresist is exposed to light which is partially blocked by a mask.

Depending upon whether the photoresist is a positive or negative photoresist, either exposed photoresist or non-exposed photoresist, respectively, is removed in the photoresist development step 36 leaving a exposed pattern on the oxide layer. In the dielectric etch step 38, the exposed pattern on the oxide layer is preferably etched in an RIE (reactive ion etch) process which etches the exposed pattern into the oxide layer while also partially etching the photoresist. This produces the residue which coats the sidewalls of the etch features while also hardening the photoresist.

In the supercritical removal process 40, supercritical carbon dioxide and a solvent are used to remove the photoresist and the residue. In the metal deposition step 42, a metal layer is deposited on the wafer filling the etched pattern and also covering non-etched regions. In subsequent processing, at least part of the metal covering the non-etched regions is removed in order to form a circuit.

Figure 3:
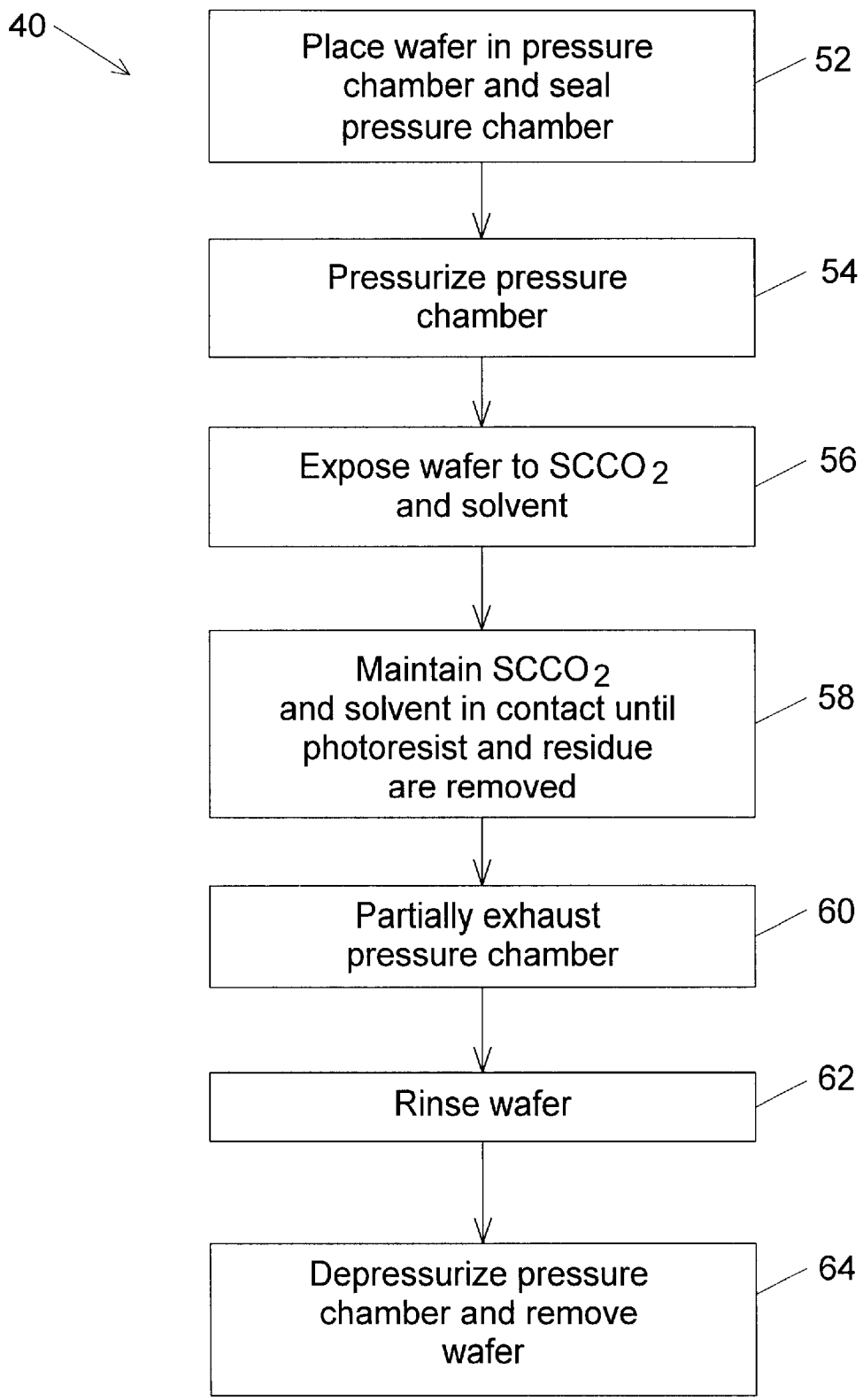
FIG. 3 illustrates, in block diagram format, a supercritical removal process of the present invention.

The supercritical removal process 40 of the present invention is illustrated, as a block diagram, in FIG. 3. The supercritical removal process 40 begins by placing the wafer, with the photoresist and the residue on the wafer, within a pressure chamber and sealing the pressure chamber in a first process step 52. In a second process step 54, the pressure chamber is pressurized with carbon dioxide until the carbon dioxide becomes the supercritical carbon dioxide ($SCCO_2$). In a third process step 56, the supercritical carbon dioxide carries a solvent into the process chamber. In a fourth process step 58, the supercritical carbon dioxide and the solvent are maintained in contact with the wafer until the photoresist and the residue are removed from the wafer. In the fourth process step 58, the solvent at least partially dissolves the photoresist and the residue. In a fifth process step 60, the pressure chamber is partially exhausted. In a sixth process step 62, the wafer is rinsed. In a seventh process step 64, the supercritical removal process 40 ends by depressurizing the pressure chamber and removing the wafer.

Figure 4:
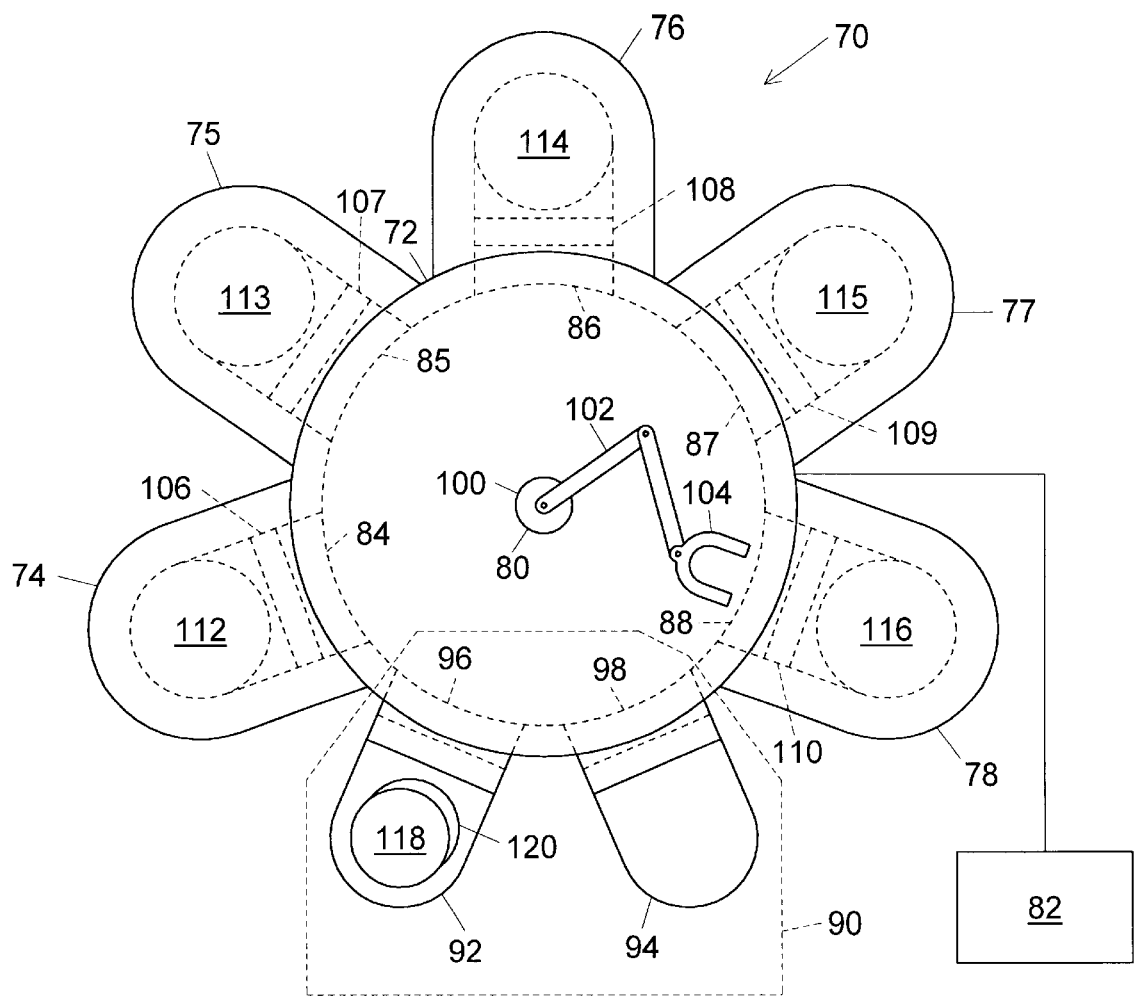
FIG. 4 illustrates the preferred supercritical processing system of the present invention.

The supercritical removal process 40 is preferably implemented in a semiconductor fabrication line by the preferred supercritical processing system of the present invention, which is illustrated in FIG. 4. The preferred supercritical processing system 70 includes a transfer module 72, first through fifth supercritical processing modules, 74–78, a robot 80, and control electronics 82. The transfer module includes first through fifth process ports, 84–88, and a transfer module entrance 90. The transfer module entrance 90 includes first and second hand-off stations, 92 and 94, and first and second entrance ports, 96 and 98.

The first through fifth supercritical processing modules, 74–78, are coupled to the transfer module 72 via the first through fifth process ports, 84–88, respectively. Preferably, the robot 80 is coupled to the transfer module 72 at a center of the transfer module 72. The first and second hand-off stations, 92 and 94, are coupled to the transfer module via the first and second entrance ports, 96 and 98, respectively. The control electronics 82 are coupled to the transfer module 72.

Preferably, the transfer module 72 operates at atmospheric pressure. Alternatively, the transfer module 72 operates at a slight positive pressure relative to a surrounding environment where the slight positive pressure is produced by an inert gas injection arrangement. The inert gas injection arrangement injects an inert gas, such as Ar, $CO_2$, or $N_2$, into the transfer module 72. This assures a cleaner processing environment within the transfer module 72.

The robot 80 preferably includes a robot base 100, a robot arm 102, and an end effector 104. The robot base is coupled to the transfer module 72. The robot arm 102 is preferably a two piece robot arm, which couples the end effector 104 to the robot base 100. The end effector 104 is configured to pick and place workpieces. Preferably, the end effector 104 is configured to pick and place the wafer. Alternatively, the end effector 104 is configured to 3 pick and place a puck or other substrate. Alternatively, a dual arm robot replaces the robot 80, where the dual arm robot includes two arms and two end effectors.

The first through fifth supercritical processing modules, 74–78, preferably include first through fifth gate valves, 106–110, respectively. The first through fifth gate valves, 106–110, couple first through fifth workpiece cavities, 112–116, of the first through fifth supercritical processing modules, 74–78, respectively, to the first through fifth process ports, 84–88.

Preferably, in operation, the robot 80 transfers a first workpiece 118 from the first hand-off station 92 to the first supercritical processing module 74, where the supercritical removal process 40 is performed. Subsequently, the robot 80 transfers a second workpiece 120 from the first hand-off station 92 to the second supercritical processing module 75, where the supercritical removal process 40 is performed. Further, the robot 80 transfers third through fifth workpieces (not shown) from the first hand-off station 92 to the third through fifth supercritical processing modules, 76–78, respectively, where the supercritical removal process 40 is performed.

In subsequent operation, the robot 80 transfers the first workpiece from the first supercritical processing module 74 to the second hand-off station 94. Further, the robot 80 transfers the second workpiece from the second supercritical processing module 75 to the second hand-off station 94. Moreover, the robot 80 transfers the third through fifth workpieces from the third through fifth supercritical processing modules, 76–78, respectively, to the second hand-off station 94.

Preferably, the first workpiece 118, the second wafer 120, and the third through fifth workpieces are wafers. Preferably, the wafers are in a first cassette at the first hand-off station 92 prior to supercritical processing. Preferably, the wafers are placed by the robot 80 in a second cassette at the second hand-off station 94 following the supercritical processing. Alternatively, the wafers begin and end in the first cassette at the first hand-off station 92 along while a second group of wafers begins and ends in the second cassette at the second hand-off station 94.

It will be readily apparent to one skilled in the art that the second hand-off station 94 can be eliminated or that additional hand-off stations can be added to the preferred supercritical processing system 70. Further, it will be readily apparent to one skilled in the art that the preferred supercritical processing system 70 can be configured with less than the first through fifth supercritical processing modules, 74–78, or more than the first through fifth supercritical processing modules, 74–78. Moreover, it will be readily apparent to one skilled in the art that the robot 80 can be replaced by a transfer mechanism which is configured to transfer the first workpiece 118, the second workpiece 120, and the third through fifth workpieces. Additionally, it will be readily apparent to one skilled in the art that the first and second cassettes can be front opening unified pods which employ a standard mechanical interface concept so that the wafers can be maintained in a clean environment separate from the surrounding environment.

Figure 5:
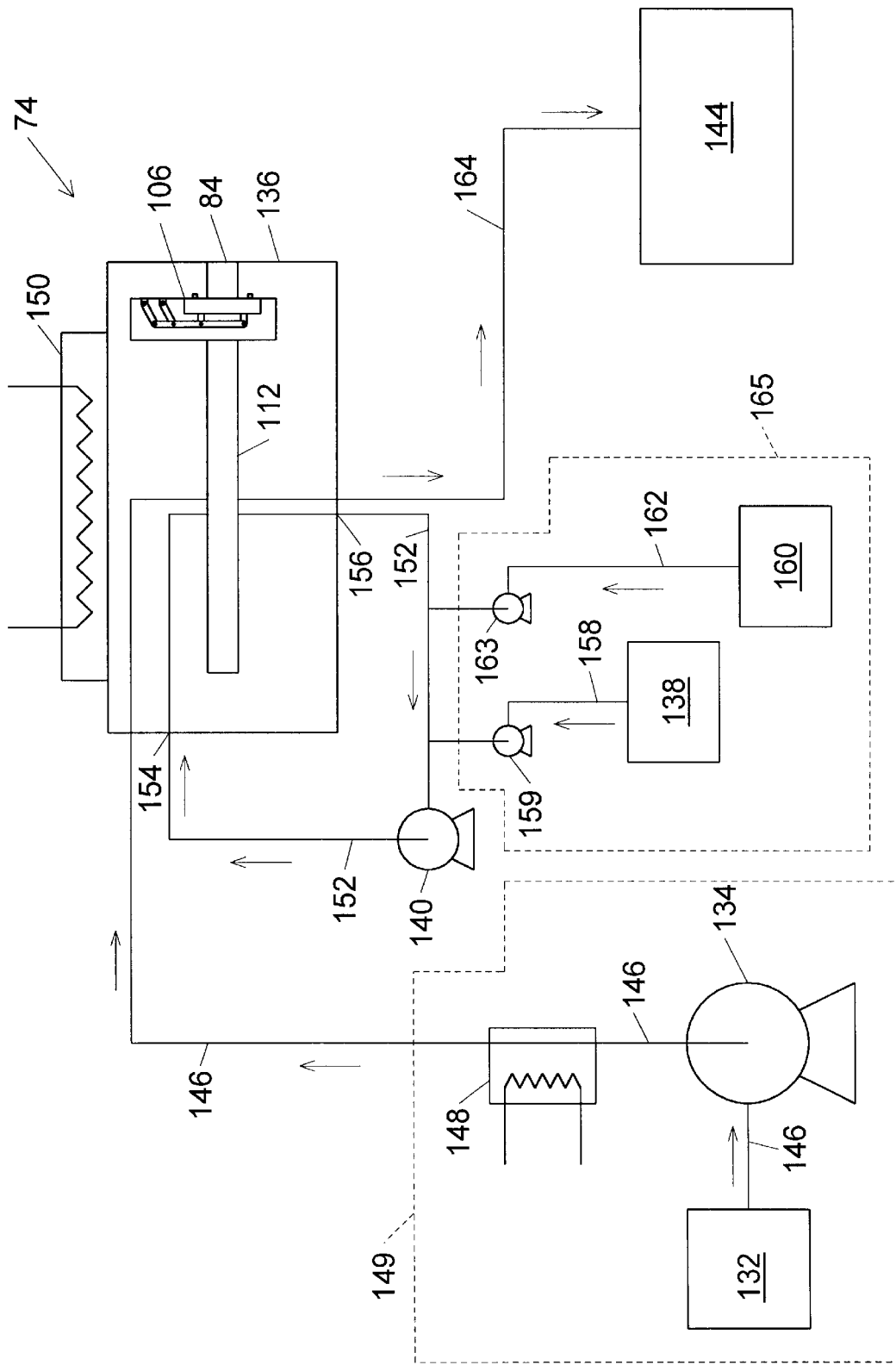
FIG. 5 illustrates the preferred supercritical processing module of the present invention.

The first supercritical processing module 74 of the present invention is illustrated in FIG. 5. The first supercritical processing module 74 includes a carbon dioxide supply vessel 132, a carbon dioxide pump 134, the pressure chamber 136, a chemical supply vessel 138, a circulation pump 140, and an exhaust gas collection vessel 144. The carbon dioxide supply vessel 132 is coupled to the pressure chamber 136 via the carbon dioxide pump 134 and carbon dioxide piping 146. The carbon dioxide piping 146 includes a carbon dioxide heater 148 located between the carbon dioxide pump 134 and the pressure chamber 136. The pressure chamber 136 includes a pressure chamber heater 150. The circulation pump 140 is located on a circulation line 152, which couples to the pressure chamber 136 at a circulation inlet 154 and at a circulation outlet 156. The chemical supply vessel 138 is coupled to the circulation line 152 via a chemical supply line 158, which includes a first injection pump 159. A rinse agent supply vessel 160 is coupled to the circulation line 152 via a rinse supply line 162, which includes a second injection pump 163. The exhaust gas collection vessel 144 is coupled to the pressure chamber 136 via exhaust gas piping 164.

The carbon dioxide supply vessel 132, the carbon dioxide pump 134, and the carbon dioxide heater 148 form a carbon dioxide supply arrangement 149. The chemical supply vessel 138, the first injection pump 159, the rinse agent supply vessel 160, and the second injection pump 163 form a chemical and rinse agent supply arrangement 165. Preferably, the carbon dioxide supply arrangement 149, the chemical and rinse agent supply arrangement 165, and the exhaust gas collection vessel 144 service the second through fifth supercritical processing modules, 75–78, (FIG. 3) as well as the first supercritical processing module 74. In other words, preferably, the first supercritical processing module 74 includes the carbon dioxide supply arrangement 149, the chemical and rinse agent supply arrangement 165, and the exhaust gas collection vessel 144 while the second through fifth supercritical processing modules, 75–78, share the carbon dioxide supply arrangement 149, the chemical and rinse agent supply arrangement 165, and the exhaust gas collection vessel 144 of the first supercritical processing module 74.

It will be readily apparent to one skilled in the art that one or more additional carbon dioxide supply arrangements, one or more additional chemical and rinse agent supply arrangements, or one or more additional exhaust gas collection vessels can be provided to service the second through fifth supercritical processing modules, 75–78. Further, it will be readily apparent to one skilled in the art that the first supercritical 10 processing module 74 includes valving, control electronics, filters, and utility hookups which are typical of supercritical fluid processing systems. Moreover, it will be readily apparent to one skilled in the art that additional chemical supply vessels could be coupled to the first injection pump 159 or that the additional chemical supply vessels and additional injection pumps could be coupled to the circulation line 152.

Referring to FIGS. 3, 4, and 5, implementation of the supercritical removal method 40 begins with the first process step 52, in which the wafer, having the photoresist or the residue (or both the photoresist and the residue) is inserted through the first process port and placed in the first wafer cavity 112 of the pressure chamber 136 by the robot 80 and, then, the pressure chamber 136 is sealed by closing the gate valve 106. In the second process step 54, the pressure chamber 136 is pressurized by the carbon dioxide pump 134 with the carbon dioxide from the carbon dioxide supply vessel 132. During the second step 54, the carbon dioxide is heated by the carbon dioxide heater 148 while the pressure chamber 136 is heated by the pressure chamber heater 150 to ensure that a temperature of the carbon dioxide in the pressure chamber 136 is above a critical temperature. The critical temperature for the carbon dioxide is 31° C. Preferably, the temperature of the carbon dioxide in the pressure chamber 136 is within a range of 45° C. to 75° C. Alternatively, the temperature of the carbon dioxide in the pressure chamber 136 is maintained within a range of from 31° C. to about 100° C.

Upon reaching initial supercritical conditions, the first injection pump 159 pumps 30 the solvent from the chemical supply vessel 138 into the pressure chamber 136 via the circulation line 152 while the carbon dioxide pump further pressurizes the supercritical carbon dioxide in the third process step 56. At a beginning of a solvent injection, the pressure in the pressure chamber 136 is about 1,100–1,200 psi. Once a desired amount of the solvent has been pumped into the pressure chamber 136 and desired supercritical conditions are reached, the carbon dioxide pump 134 stops pressurizing the pressure chamber 136, the first injection pump 159 stops pumping the solvent into the pressure chamber 136, and the circulation pump 140 begins circulating the supercritical carbon dioxide and the solvent in the fourth process step 58. Preferably, the pressure at this point is about 2,700–2,800 psi. By circulating the supercritical carbon dioxide and the solvent, the supercritical carbon dioxide maintains the solvent in contact with the wafer. Additionally, by circulating the supercritical carbon dioxide and the solvent, a fluid flow enhances removal of the photoresist and the residue from the wafer.

Preferably, the wafer is held stationary in the pressure chamber 136 during the fourth process step 58. Alternatively, the wafer is spun within the pressure chamber 136 during the fourth process step 58.

After the photoresist and the residue has been removed from the wafer, the pressure chamber 136 is partially depressurized by exhausting some of the supercritical carbon dioxide, the solvent, removed photoresist, and removed residue to the exhaust gas collection vessel 144 in order to return conditions in the pressure chamber 136 to near the initial supercritical conditions in the fifth process step 60. Preferably, the pressure within the pressure chamber 136 is cycled at least once at this point by raising the pressure and then again partially exhausting the pressure chamber 136. This enhances a cleanliness within the pressure chamber 136. In the fifth process step 60, the pressure chamber is preferably maintained above the critical temperature and above a critical pressure. The critical pressure for carbon dioxide is 1,070 psi.

In the sixth process step 62, the second injection pump 163 pumps a rinse agent from the rinse agent supply vessel 160 into the pressure chamber 136 via the circulation line while the carbon dioxide pump 134 pressurizes the pressure chamber 136 to near the desired supercritical conditions and, then, the circulation pump 140 circulates the supercritical carbon dioxide and the rinse agent in order to rinse the wafer. Preferably, the rinse agent is selected from the group consisting of water, alcohol, acetone, and a mixture thereof. More preferably, the rinse agent is the mixture of the alcohol and the water. Preferably, the alcohol is selected from the group consisting of isopropyl alcohol, ethanol, and other low molecular weight alcohols. More preferably, the alcohol is selected from the group consisting of the isopropyl alcohol and the ethanol. Most preferably, the alcohol is the ethanol.

Preferably, the wafer is held stationary in the pressure chamber 136 during the sixth process step 62. Alternatively, the wafer is spun within the pressure chamber 136 during the sixth process step 62.

In the seventh process step 64, the pressure chamber 136 is depressurized, by exhausting the pressure chamber 136 to the exhaust gas collection vessel 144, the gate valve 106 is opened, and the wafer is removed from the pressure chamber 136 by the robot 80.

Alternative supercritical removal processes of the present invention are taught in the following patent applications, all of which are incorporated in their entirety by reference: U.S. patent application Ser. No. 09/697,227, filed on Oct. 25, 2000; U.S. patent application No. 09/389,788, filed on Sep. 3, 1999; U.S. patent application No. 09/085,391, filed on May 27, 1998; and U.S. Provisional Patent Application No. 60/047,739, filed May 27, 1997.

Figure 6:
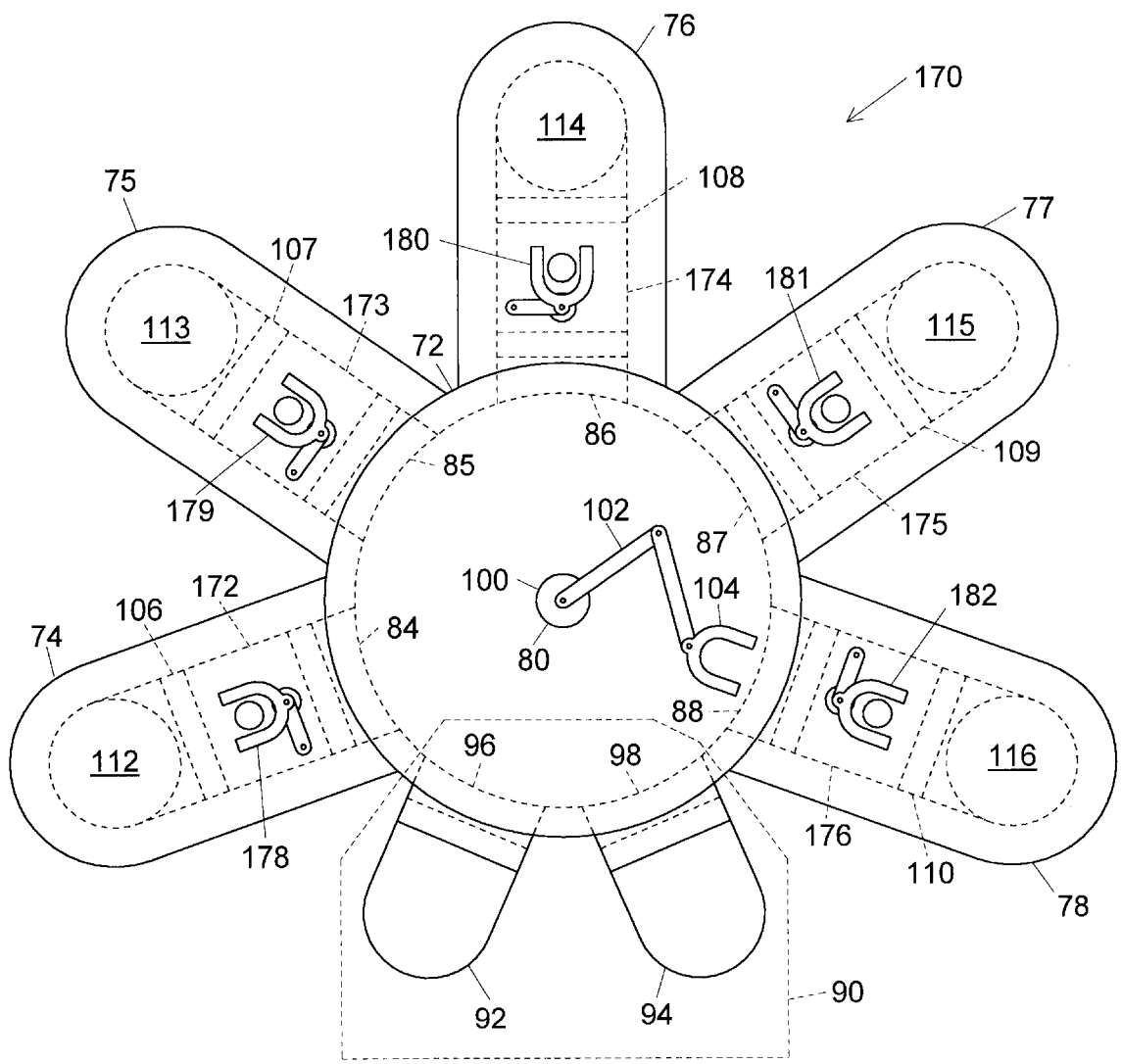
FIG. 6 illustrates a first alternative supercritical processing system of the present invention.

A first alternative supercritical processing system of the present invention is illustrated in FIG. 6. The first alternative supercritical processing system 170 adds first through fifth ante-chambers, 172–176, and first through fifth ante-chamber robots, 178–182, to the preferred supercritical processing system 70. In operation, the first through fifth ante-chambers, 172–176, operate from about atmospheric pressure to some elevated pressure. This allows the first through fifth wafer cavities, 112–16, to operate between the elevated pressure and supercritical pressure and, thus, enhancing throughput. Alternatively, in the first alternative supercritical processing system 170, the first through fifth ante-chamber robots, 178–182, are replaced with first through fifth magnetically coupled mechanisms, or first through fifth hydraulically driven mechanisms, or first through fifth pneumatically driven mechanisms.

Figure 7:
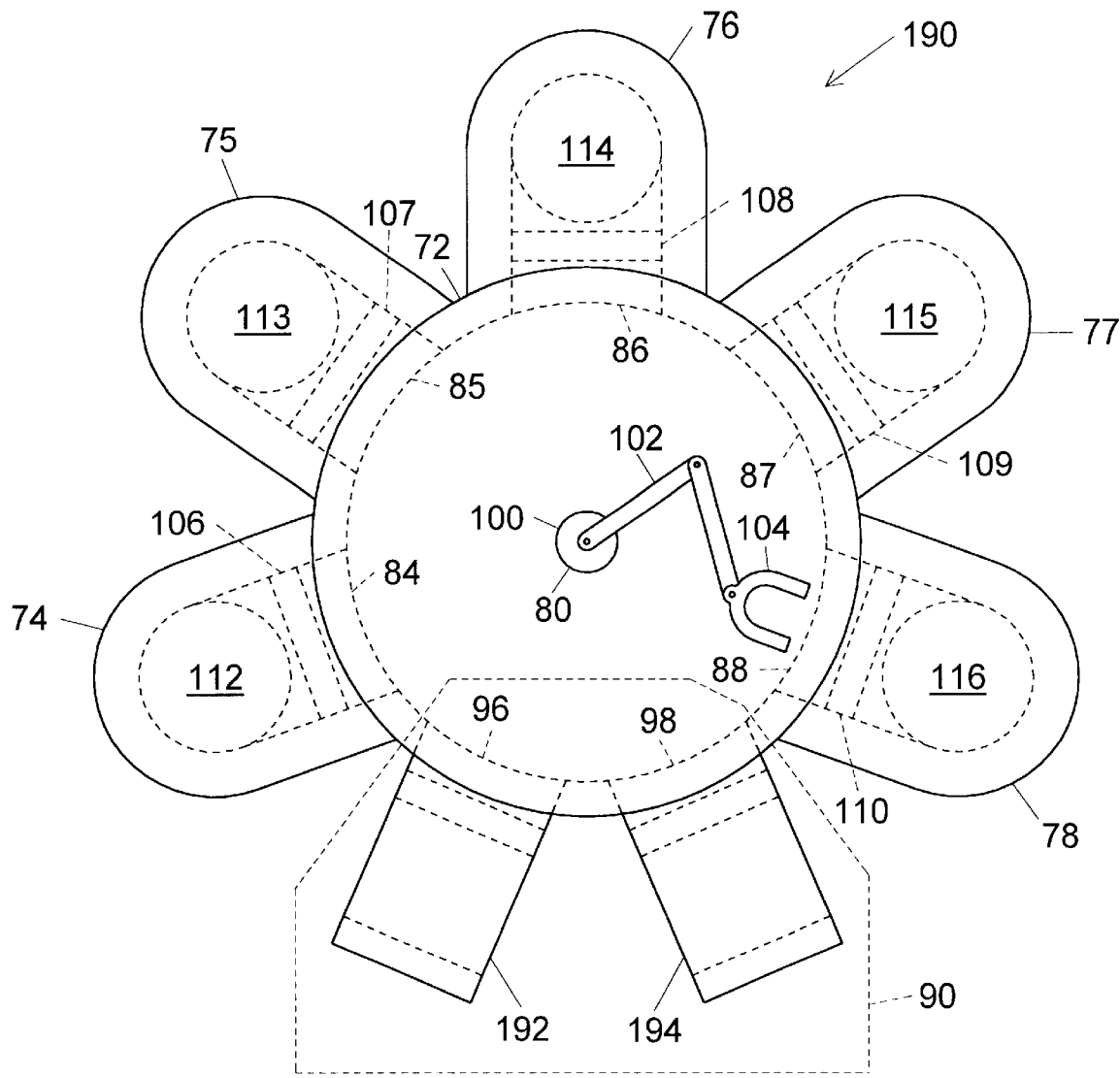
FIG. 7 illustrates a second alternative supercritical processing system of the present invention.

A second alternative supercritical processing system of the present invention of the present invention is illustrated in FIG. 7. The second alternative supercritical processing system 190 replaces the first and second hand-off stations, 92 and 94, of the preferred supercritical processing system 70 with first and second loadlocks, 192 and 194. In operation, the transfer module operates at a second elevated pressure and, thus, also enhances the throughput.

Figure 8:
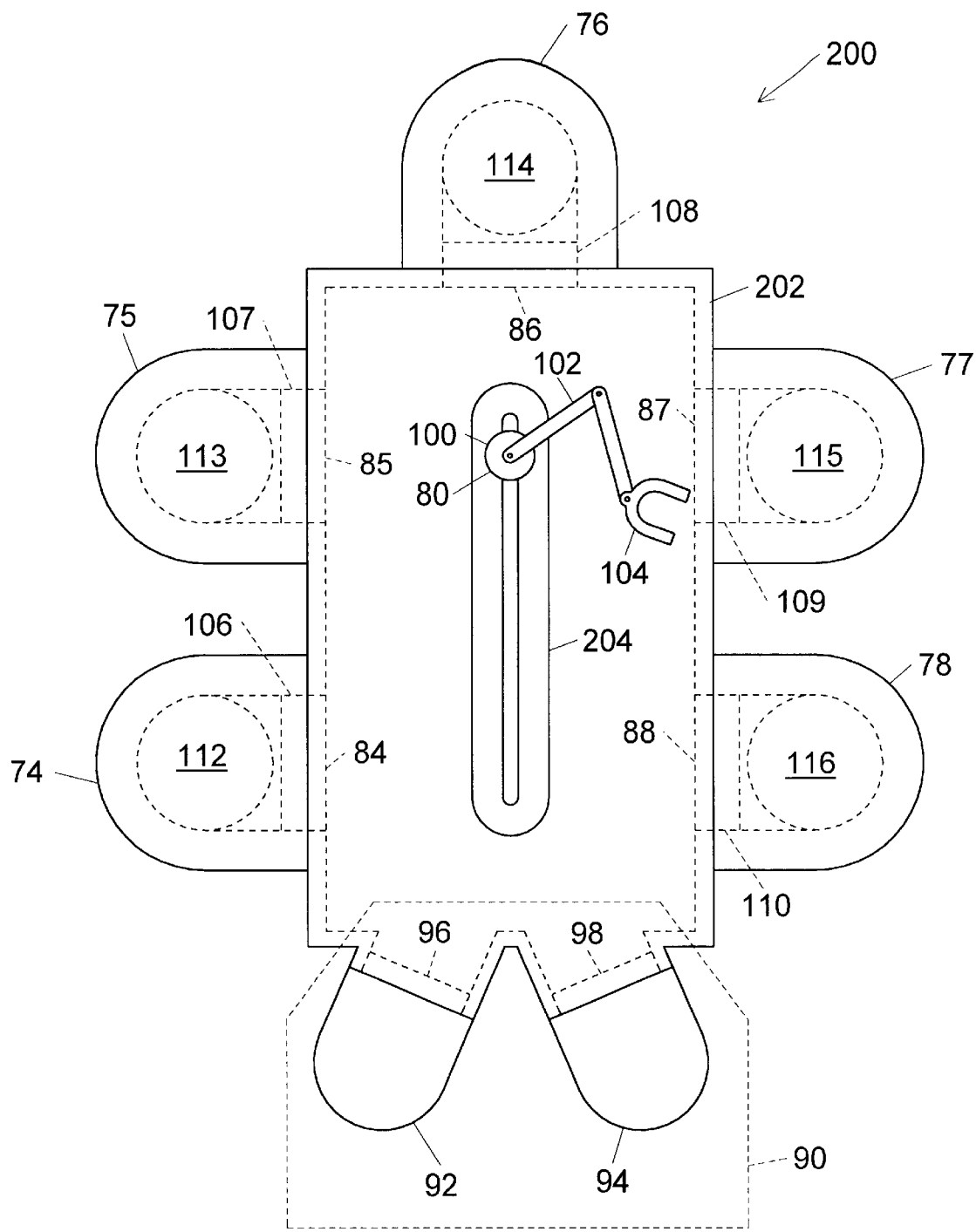
FIG. 8 illustrates a third alternative supercritical processing system of the present invention.

A third alternative supercritical processing system of the present invention of the present invention is illustrated in FIG. 8. The third alternative supercritical processing system 200 comprises an alternative transfer module 202 and a robot track 204.

Figure 9:
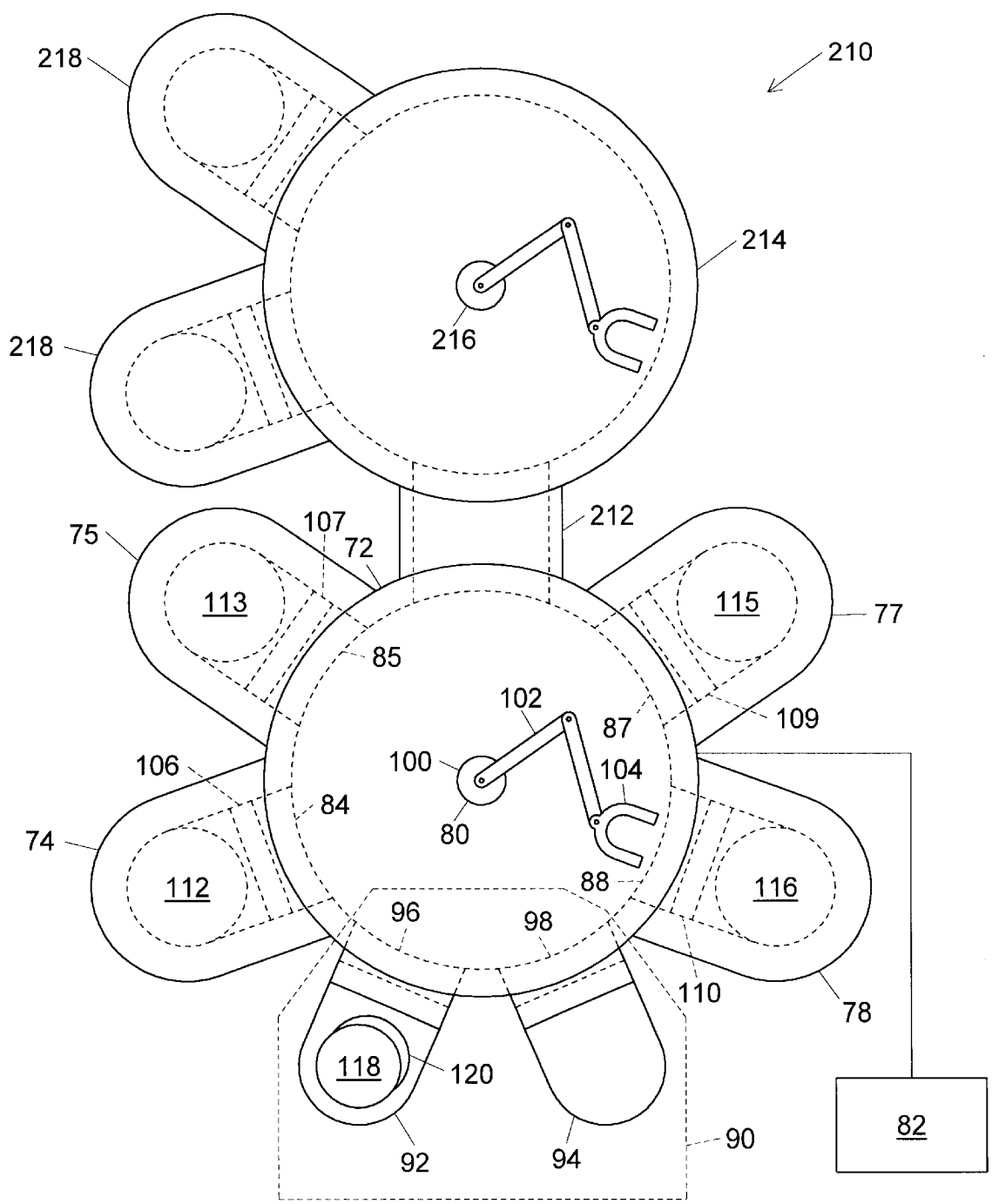
FIG. 9 illustrates a fourth alternative supercritical processing system of the present invention.

A fourth alternative supercritical processing system of the present invention is illustrated in FIG. 9. The fourth alternative supercritical processing system 210 preferably replaces the third supercritical processing module 76 of the preferred supercritical processing system 70 with a third hand-off station 212 and adds a second transfer module 214, a second robot 216, and additional supercritical processing modules 218. In the fourth alternative supercritical processing system 210, the third hand-off station 212 couples the transfer module 72 to the second transfer module 214. The second robot 216 preferably resides in the second transfer module 214. The additional supercritical processing modules 218 are coupled to the second transfer module 214. Thus, the fourth alternative supercritical processing system 210 allows for more supercritical processing modules than the preferred supercritical processing system 70.

A fifth alternative supercritical processing system of the present invention eliminates the transfer module 72 of the preferred supercritical processing system 70. In the fifth alternative supercritical processing system, the robot 80 is configured to move workpieces between the first and second hand-off stations, 92 and 94, and the first through fifth supercritical processing modules, 74–78, without benefitting from a covering effect provided by the transfer module 72.

A sixth alternative supercritical processing system of the present invention adds an inspection station to the preferred supercritical processing system 70. In the sixth alternative supercritical processing system, the first workpiece 118, the second workpiece 120, and the third through fifth workpieces are transferred to the inspection station prior to being transferred to the second hand-off station 94. At the inspection station, an inspection of the workpieces ensures that the photoresist and the residue have been removed from the workpieces. Preferably, the inspection station uses spectroscopy to inspect the workpieces.

A seventh alternative supercritical processing system of the present invention adds a front-end robot to the preferred supercritical processing system 70. In the seventh alternative supercritical processing system, the front-end robot resides outside of the entrance to the transfer module 72 and the first and second cassettes are located away from the first and second hand-off stations, 92 and 94. The front-end robot is preferably configured to move the wafers from the first cassette to the first hand-off station 92 and is also preferably configured to move the wafers from the second hand-off station 94 to the second cassette.

An eighth alternative supercritical processing system of the present invention adds a wafer orientation mechanism to the preferred supercritical processing system 70. The wafer orientation mechanism orients the wafer according to a flat, a notch, or an other orientation indicator. Preferably, the wafer is oriented at the first hand-off station 92. Alternatively, the wafer is oriented at the second hand-off station 94.

A first alternative supercritical processing module of the present invention replaces the pressure chamber 136 and gate valve 106 with an alternative pressure chamber. The alternative pressure chamber comprises a chamber housing and a hydraulicly driven wafer platen. The chamber housing comprises a cylindrical cavity which is open at its bottom. The hydraulicly driven wafer platen is configured to seal against the chamber housing outside of the cylindrical cavity. In operation, the wafer is placed on the hydraulicly driven wafer platen. Then, the hydraulicly driven wafer platen moves upward and seals with the chamber housing. Once the wafer has been processed, the hydraulicly driven wafer platen is lowered and the wafer is taken away.

A second alternative supercritical processing module of the present invention places alternative inlets for the circulation line 152 to enter the wafer cavity 112 at a circumference of the wafer cavity 112 and places an alternative outlet at a top center of the wafer cavity 112. The alternative inlets are preferably configured to inject the supercritical carbon dioxide in a plane defined by the wafer cavity 112. Preferably, the 402 alternative inlets are angled with respect to a radius of the wafer cavity 112 so that in operation the alternative inlets and the alternative outlet create a vortex within the wafer cavity 112.

It will be readily apparent to one skilled in the art that other various modifications may be made to the preferred embodiment without departing from the spirit and scope of the invention as defined by the appended claims.

We claim:

1. An apparatus for supercritical processing of first and second workpieces comprising:
    a. a transfer module having an entrance;
    b. a first supercritical processing module coupled to the transfer module, the first supercritical processing module configured to perform supercritical processing on the first workpiece in a first workpiece cavity having a substantially constant first volume;
    c. a second supercritical processing module coupled to the transfer module, the second supercritical processing module configured to perform supercritical processing on the second workpiece in a second workpiece cavity having a substantially constant second volume;
    d. a first supercritical condition generator, coupled to the first workpiece cavity:
    e. a second supercritical condition generator, coupled to the second workpiece cavity; and
    f. a transfer mechanism coupled to the transfer module, the transfer mechanism configured to move the first workpiece between the entrance and the first supercritical processing module, the transfer mechanism configured to move the second workpiece between the entrance and the second supercritical processing module.

2. The apparatus of claim 1, wherein the transfer module is configured to operate at about atmospheric pressure.

3. The apparatus of claim 1 wherein the transfer module further comprises means for maintaining a slight positive pressure in the transfer module relative to a surrounding environment.

4. The apparatus of claim 3 wherein the means for maintaining the slight positive pressure in the transfer module comprise an inert gas injection arrangement.

5. The apparatus of claim 2 wherein the entrance of the transfer module comprises a hand-off station.

6. The apparatus of claim 5 wherein the entrance of the transfer module further comprises an additional hand-off station.

7. The apparatus of claim 1 wherein the transfer module is configured to operate at an elevated pressure and further wherein the entrance of the transfer module comprises a loadlock.

8. The apparatus of claim 7 wherein the entrance of the transfer module further comprises an additional loadlock.

9. The apparatus of claim 1 wherein the transfer mechanism comprises a robot.

10. The apparatus of claim 9 wherein the transfer module comprises a circular configuration.

11. The apparatus of claim 10 wherein the robot comprises a central robot, the central robot occupying a center of the circular configuration.

12. The apparatus of claim 9 wherein the transfer module comprises a track configuration.

13. The apparatus of claim 12 wherein the robot comprises a tracked robot, the tracked robot comprising the robot coupled to a track such that the robot moves along the track in order to reach the first and second processing module located along the track.

14. The apparatus of claim 13 further comprising third and fourth supercritical processing modules, the third and fourth supercritical processing modules located along the track, the third and fourth supercritical processing modules located opposite the first and second supercritical processing modules relative to the track.

15. The apparatus of claim 9 wherein the robot comprises an extendable arm and an end effector.

16. The apparatus of claim 15 wherein the robot further comprises an additional arm and an additional end effector.

17. The apparatus of claim 1 wherein the first supercritical processing module comprises a first pressure vessel and further wherein the second supercritical processing module comprises a second pressure vessel.

18. The apparatus of claim 17 wherein:
a. the first pressure vessel comprises the first workpiece cavity and a first pressure vessel entrance, the first workpiece cavity holding the first workpiece during supercritical processing, the first pressure vessel entrance configured to provide ingress and egress for the first workpiece; and
b. the second pressure vessel comprises the second workpiece cavity and a second pressure vessel entrance, the second workpiece cavity holding the second workpiece during the supercritical processing, the second pressure vessel entrance configured to provide ingress and egress for the first workpiece.

19. The apparatus of claim 18 wherein the transfer mechanism is configured to place the first and second workpieces in the first and second workpiece cavities, respectively.

20. The apparatus of claim 19 wherein the transfer module and the supercritical processing module are configured to operate at supercritical conditions.

21. The apparatus of claim 19 further comprising first and second gate valves, the first gate valve coupling the transfer module and the first supercritical processing module, the second gate valve coupling the transfer module and the second supercritical processing module.

22. The apparatus of claim 18 further comprising first and second antechambers, the first ante-chamber coupling the transfer module and the first supercritical processing module, the second ante-chamber coupling the transfer module and the second supercritical processing module.

23. The apparatus of claim 1 further comprising means for pressurizing the first and second supercritical processing modules.

24. The apparatus of claim 23 wherein the means for pressurizing comprises a $CO_2$ pressurizing configuration which comprises a $CO_2$ supply vessel coupled to a pump which is coupled to the first and second supercritical processing modules such that the $CO_2$ pressurizing configuration pressurizes the first supercritical processing module independently of the second supercritical processing module and further such that the $CO_2$ pressurizing configuration pressurizes the second supercritical processing module independently of the first supercritical processing module.

25. The apparatus of claim 18 further comprising first and second means for sealing, the first means for sealing operable to seal the first pressure vessel entrance, the second means for sealing operable to seal the second pressure vessel entrance.

26. The apparatus of claim 1 further comprising means for controlling such that the means for controlling directs the transfer mechanism to move the first and second workpieces between the entrance of the transfer module and the first and second supercritical processing modules, respectively, and further such that the means for controlling controls the first supercritical processing module independently of the second supercritical processing module.

27. An apparatus for supercritical processing of first and second workpieces comprising:
a. a hand-off station;
b. first and second supercritical processing modules coupled to the hand-off station, the first supercritical processing module having a first workpiece cavity and configured to perform supercritical processing on the first workpiece in the first workpiece cavity, the first workpiece cavity having a substantially constant first volume, and the second supercritical processing module having a second workpiece cavity and configured to perform supercritical processing on the second workpiece in the second workpiece cavity, the second workpiece cavity having a substantially constant second volume;
c. first and second supercritical condition generators, wherein the first supercritical condition generator, is coupled to the first workpiece cavity and the second supercritical condition generator, is coupled to the second workpiece cavity, and
d. a transfer mechanism coupled to the hand-off station, the transfer mechanism coupled to the first and second supercritical processing modules, the transfer mechanism configured to move the first workpiece between the hand-off station and the first supercritical processing module, the transfer mechanism configured to move the second workpiece between the hand-off station and the second supercritical processing module.

* * * * *

UNITED STATES PATENT AND TRADEMARK OFFICE
CERTIFICATE OF CORRECTION

PATENT NO.    : 6,748,960 B1
DATED         : June 15, 2004
INVENTOR(S)   : Maximilian A. Biberger et al.

It is certified that error appears in the above-identified patent and that said Letters Patent is hereby corrected as shown below:

Column 5,
Line 14, replace "configured to 3 pick" with -- configured to pick --.

Column 6,
Lines 55-56, replace "the first supercritical 10 processing module 74" with -- the first supercritical processing module 74 --.

Column 7,
Line 19, replace "pumps 30 the solvent" with -- pumps the solvent --.

Column 9,
Line 60, replace "the 402 alternative inlets" with -- the alternative inlets --.

Column 10,
Line 15, element d, replace "a first supercritical condition generator, coupled" with -- a first supercritical condition generator comprising a vessel, a pump, and a heater for generating supercritical condition coupled --.
Line 17, element e, replace "a second supercritical condition generator, coupled" with -- a second supercritical condition generator comprising a vessel, a pump, and a heater for generating supercritical condition coupled --.

Column 12,
Line 33, element c, replace "wherein the first supercritical condition generator, is" with -- wherein the first supercritical condition generator comprising a vessel, a pump, and a heater for generating supercritical condition is --.

UNITED STATES PATENT AND TRADEMARK OFFICE
CERTIFICATE OF CORRECTION

PATENT NO. : 6,748,960 B1
DATED : June 15, 2004
INVENTOR(S) : Maximilian A. Biberger et al.

It is certified that error appears in the above-identified patent and that said Letters Patent is hereby corrected as shown below:

<u>Column 12, cont'd.,</u>
Lines 34-35, element c, replace "and the second supercritical condition generator, is" with -- and the second supercritical condition generator comprising a vessel, a pump, and a heater for generating supercritical condition is --.

Signed and Sealed this

Twenty-sixth Day of October, 2004

JON W. DUDAS
*Director of the United States Patent and Trademark Office*